United States Patent [19]
Yoshida

[11] Patent Number: 5,612,229
[45] Date of Patent: Mar. 18, 1997

[54] METHOD OF PRODUCING PHOTOVOLTAIC DEVICE

[75] Inventor: Yumi Yoshida, Sagamihara, Japan

[73] Assignee: Canon Kabushiki Kaisha, Tokyo, Japan

[21] Appl. No.: 448,760

[22] Filed: May 24, 1995

[30] Foreign Application Priority Data

May 30, 1994 [JP] Japan .................................. 6-116734

[51] Int. Cl.$^6$ .......................... H01L 31/18; H01L 31/20
[52] U.S. Cl. .............. 437/4; 136/256; 136/258; 136/259; 204/192.29; 257/436; 257/458; 437/2; 437/181; 437/189
[58] Field of Search ............... 204/192.29, 136/256, 136/258 AM, 259; 437/2–5, 180–181, 189, 194; 257/436, 458

[56] References Cited

U.S. PATENT DOCUMENTS

| | | | |
|---|---|---|---|
| 4,419,533 | 12/1983 | Czubatyj et al. | 136/259 |
| 4,842,705 | 6/1989 | Mueller | 204/192.29 |
| 5,230,746 | 7/1993 | Wiedeman et al. | 136/249 |

FOREIGN PATENT DOCUMENTS

| | | | |
|---|---|---|---|
| 63-224188 | 9/1988 | Japan | 204/192.22 |
| 02-55246 | 2/1990 | Japan | 204/192.22 |
| 02-066158 | 3/1990 | Japan | 427/529 |
| 5-121769 | 5/1993 | Japan | 136/259 |

*Primary Examiner*—Aaron Weisstuch
*Attorney, Agent, or Firm*—Fitzpatrick, Cella, Harper & Scinto

[57] ABSTRACT

There is provided a method and apparatus for producing a photovoltaic device which is excellent in conversion efficiency and economical efficiency of mass production. Such a photovoltaic device is produced by forming a first metal oxide film on a metal member by non-reactive sputtering, forming a second metal oxide film on the first metal oxide film by reactive sputtering, and forming a semiconductor on the second metal oxide film.

48 Claims, 3 Drawing Sheets

METHOD OF PRODUCING PHOTOVOLTAIC DEVICE

BACKGROUND OF THE INVENTION

1. Field of the Invention

The present invention relates to a method of producing a solar cell, which is provided with a back reflecting layer and has high conversion efficiency, with high productive efficiency, and more particularly, to a method of producing a photovoltaic device by a thin film forming apparatus using sputtering or the like.

2. Description of the Related Art

In recent years, environmental destruction, ecology and the like have become important considerations, and photovoltaic devices as photoelectric conversion devices have been anticipated as one main energy source. Active studies have been conducted on a non-single crystal photovoltaic device which is a thin-film semiconductor which can be economically and efficiently mass produced and is capable of being produced at low cost. However, such a photovoltaic device as a thin-film semiconductor needs further improvement since it has lower conversion efficiency than that of a silicon crystal photovoltaic device and insufficient reliability. FIG. 2 shows a layer structure of a photovoltaic device as a thin-film semiconductor which the present inventor has studied. Referring to FIG. 2, the photovoltaic device is composed of a substrate 201, an underlying metal layer 202 laid on the substrate 201, a metal oxide film 203, semiconductor layers 204, 205, and 206 forming a PIN junction, a transparent conductive layer 207, and a collector electrode 208. The underlying metal layer 202 and the metal oxide film 203 constitute a back reflecting layer. The back reflecting layer serves to return unabsorbed light into the semiconductor layers 204, 205, and 206 by increasing the reflectance of the surface of the substrate 201, to efficiently use the incident light, and to increase light absorption efficiency. The use of the metal oxide film having proper resistance in the back reflecting layer prevents surplus current from flowing between electrodes even if a short circuit occurs in the semiconductor layers 204, 205, and 206. In view of the characteristics of the films, it is required that the underlying metal layer 202 have high reflectance and the metal oxide film 203 have high transmittance and proper resistance. Improvement in performance of the back reflecting layer leads to improvement in conversion efficiency and reliability of the thin-film semiconductor photovoltaic device. In the back reflecting layer, it is preferable that the underlying metal layer 202 be made of a metal having high reflectance, for example, Ag, Al, and Cu, and that the metal oxide film 203 be made of an oxide having high transmittance and proper resistance, such as ZnO, $SnO_2$, $In_2O_3$, and TiO.

Thin film forming methods, such as sputtering, ion plating, CVD, and vacuum evaporation, are used to form the above-mentioned back reflecting layer. In view of mass productivity, sputtering is used most frequently since it can achieve high-rate deposition, low device cost, relatively easy increase of area, stable film quality, uniform film thickness and high operability. The sputtering method will now be described.

Sputtering methods for forming metal oxide films are roughly divided into: 1) direct (i.e., non-reactive) sputtering which forms a metal oxide film by using a metal oxide target and Ar gas as discharge gas; and 2) reactive sputtering which forms a metal oxide film by using a target of the metal to be contained in the metal oxide film, oxygen gas as reactive gas, and Ar gas as discharge gas and reacting sputtered particles of the target metal with the oxygen gas. Non-reactive sputtering, which uses an easy-to-use metal oxide target and Ar gas as discharge gas, is generally adopted. Although this method can obtain a stable film, the metal oxide target is made of relatively fragile ceramic, and there is a limit to the power to be applied thereto. Therefore, the film deposition rate is determined, that is, limited by the power. The present maximum applied power and film deposition rate for stable film deposition are respectively about 5.5 kw and about 50 Å/sec. Abnormal discharge occurs frequently and stable discharge cannot be obtained when more than 6.0 kw of power is applied, and the target is broken when 10.0 kw of power is applied. Film deposition at a higher rate is essential for economical, efficient mass production which is the greatest advantage of the thin-film semiconductor photovoltaic device.

In order to achieve the high deposition rate, reactive sputtering, which uses a target made of the metal contained in the metal oxide film to be formed, oxygen gas as reactive gas, and Ar gas as discharge gas, is suitable. According to this method, the target is made of metal and more power can be applied thereto than to ceramic targets. The present maximum applied power and film deposition rate are respectively about 12 kw and about 115 Å/sec. More than twice as high a film deposition rate as that in non-reactive sputtering can be obtained. Even if more than twice as much power as that in direct sputtering is applied, abnormal discharge and target breakage incident to application of high power, which are problems of non-reactive sputtering, do not occur.

As mentioned above, reactive sputtering, which uses a target of metal contained in a metal oxide film to be formed, oxygen gas as reactive gas, and Ar gas as discharge gas, is suited to form a film at a high film deposition rate. According to this method, the target is a metal target, to which more power can be applied compared to a metal oxide target. However, in this method, the large quantity of oxygen gas used as reactive gas oxidizes the underlying metal layer. The more sensitive to oxidation the material of the underlying layer is, the more such oxidation occurs. The oxidized underlying layer discolors, lowers light reflectance and does not act as an underlying metal layer. Furthermore, the resistance thereof increases.

Regarding such oxidation, Japanese Patent Laid-Open No. 2-66158 discloses a method of forming a transparent film, and specifically, mentions that a transparent film is formed on an Ag film at a high rate by ion plating since the film deposition rate is low and the Ag film is oxidized during sputtering. It is also mentioned that this method has the advantage of easily forming the transparent film on the Ag film without oxidizing the Ag film. However, this Japanese patent does not refer to a film forming method which solves the problems of easy-to-use sputtering, which is capable of easily forming a high-quality, large-area film, and is useful as a back surface layer of a photovoltaic device which needs high weather resistance.

On the other hand, Japanese Patent Laid-Open No. 63-224188 discloses a method of forming a ferroelectric thin film, and specifically, mentions that a ferroelectric thin film is deposited on an ITO film by using a sputter gas atmosphere containing no oxidizing gas at the beginning of film deposition and introducing oxidizing gas into the sputter gas atmosphere in the middle of the film deposition, in order to prevent the ITO film from being oxidized by oxygen gas. It is also mentioned that this method can easily deposit the ferroelectric film on the ITO film without increasing the sheet resistance of the ITO film. However, the oxidizing gas is used in the non-reactive sputtering film deposition process only to make up for insufficient oxidation of an insulating film made of a ferroelectric film, and reactive sputtering is not referred to at all. The target to be prevented from oxidizing is an ITO film as a metal oxide film. This Japanese Patent Laid-Open No. 63-224188 does not refer to either an underlying layer made of metal or a photovoltaic device which is required to have high weather resistance.

Japanese Patent Laid-Open No. 2-55246 discloses a process wherein a silicon carbide film is formed by using a target of silicon carbide and Ar gas, and then, a transparent dielectric film is formed in an atmosphere of Ar gas and oxygen gas by using a metal target. According to this patent, the formed transparent dielectric film has excellent wear resistance and the silicon carbide film is prevented from oxidizing by diffusion of oxygen in the air during subsequent high temperature treatment of a glass substrate. However, this patent reveals the effect of oxidation in the high temperature treatment after film deposition, and does not refer to a film deposition process. Furthermore, the target to be prevented from oxidizing is a silicon carbide film, and no mention is made of an underlying layer made of metal, or a photovoltaic device, which particularly needs high weather resistance.

Such oxidation has a significant effect on the characteristics of the films. Depending on the kind of metal, oxidation causes increased resistance and discoloration. As mentioned above, in the back reflecting layer, the underlying metal layer must have high reflectance and the metal oxide layer must have high transmittance and proper resistance. In other words, if increased resistance and discoloration are caused by oxidation, the back reflecting layer of the thin-film semiconductor photovoltaic device does not provide its required function. Therefore, under the present conditions, a metal oxide film must be deposited at a low rate by non-reactive sputtering, which can form a metal oxide film of stable quality by using a metal oxide target.

SUMMARY OF THE INVENTION

In view of the above described problems, the present invention is aimed at providing a method for rapidly forming a metal oxide film, which is not oxidized and sufficiently satisfies the characteristics required of a back reflecting layer.

In order to achieve the above object, according to one aspect of the invention, there is provided a method of producing a photovoltaic device, comprising the steps of forming a first metal oxide film on a metal member by non-reactive sputtering, forming a second metal oxide film on the first metal oxide film by reactive sputtering, and forming a semiconductor on the second metal oxide film.

According to another aspect of the invention, there is provided a thin film forming apparatus, comprising a metal film forming chamber for forming a metal member on a weblike substrate, a first metal oxide film forming chamber connected to the metal film forming chamber through a gas gate to perform non-reactive sputtering therein, and a second metal oxide film forming chamber connected to the first metal oxide film forming chamber through a gas gate to perform reactive sputtering therein.

Accordingly, the method of the present invention can form, at low cost, a photovoltaic device with increased conversion efficiency, reliability, and weather resistance.

Furthermore, the film forming apparatus of the present invention can form part of the photovoltaic device having increased conversion efficiency, reliability, and weather resistance, at low cost.

These and other objects, features and advantages of the present invention will become more apparent from the following description of the preferred embodiments taken in conjunction with the accompanying drawings.

DESCRIPTION OF THE PREFERRED EMBODIMENTS

As a result of vigorous studies, the present inventor found that enhancement of conversion efficiency, reliability, and weather resistance of a photovoltaic device is achieved by a photovoltaic device producing method comprising the steps of forming a first metal oxide film on a metal member by non-reactive sputtering, forming a second metal oxide film on the first metal oxide film by reactive sputtering, and forming a semiconductor on the second metal oxide film, that is, the above required characteristics can be enhanced by performing multilayer film deposition using different film forming methods. Furthermore, the present invention allows reduction in production costs.

A mechanism of the present invention will now be described.

Oxidation occurs in a reactive sputtering film deposition process which uses a target made of the metal contained in a metal oxide film, oxygen gas as reactive gas, and Ar gas as discharge gas. An underlying metal layer of the photovoltaic device is exposed to plasma during the film deposition. Oxygen, oxygen ions, ozone, and the like exist in the plasma besides Ar, and it is assumed that the underlying metal layer is oxidized by reaction with these substances. In particular, ozone is, as is well known, a strong oxidizer, and oxidizes and blackens Ag and the like. It is also well known that Al and the like are oxidized by ozone whereby the resistance thereof is increased. Therefore, in order to prevent oxidation of the underlying metal layer, a thin metal oxide film is deposited on the underlying metal layer by non-reactive sputtering which uses a metal oxide target and Ar gas as discharge gas without employing oxygen gas. After that, a metal oxide film is deposited on the previously formed metal oxide film by reactive sputtering which uses a target made of the metal contained in the metal oxide film, oxygen gas as reactive gas, and Ar gas as discharge gas. It is considered that the above film forming method prevents oxidation of the underlying metal layer, and reactive sputtering achieves high-rate deposition of the metal oxide film.

Although a detailed description of preferred embodiments of the present invention will now be given in conjunction with the accompanying drawings, the present invention is not limited to these embodiments.

Figure 3:
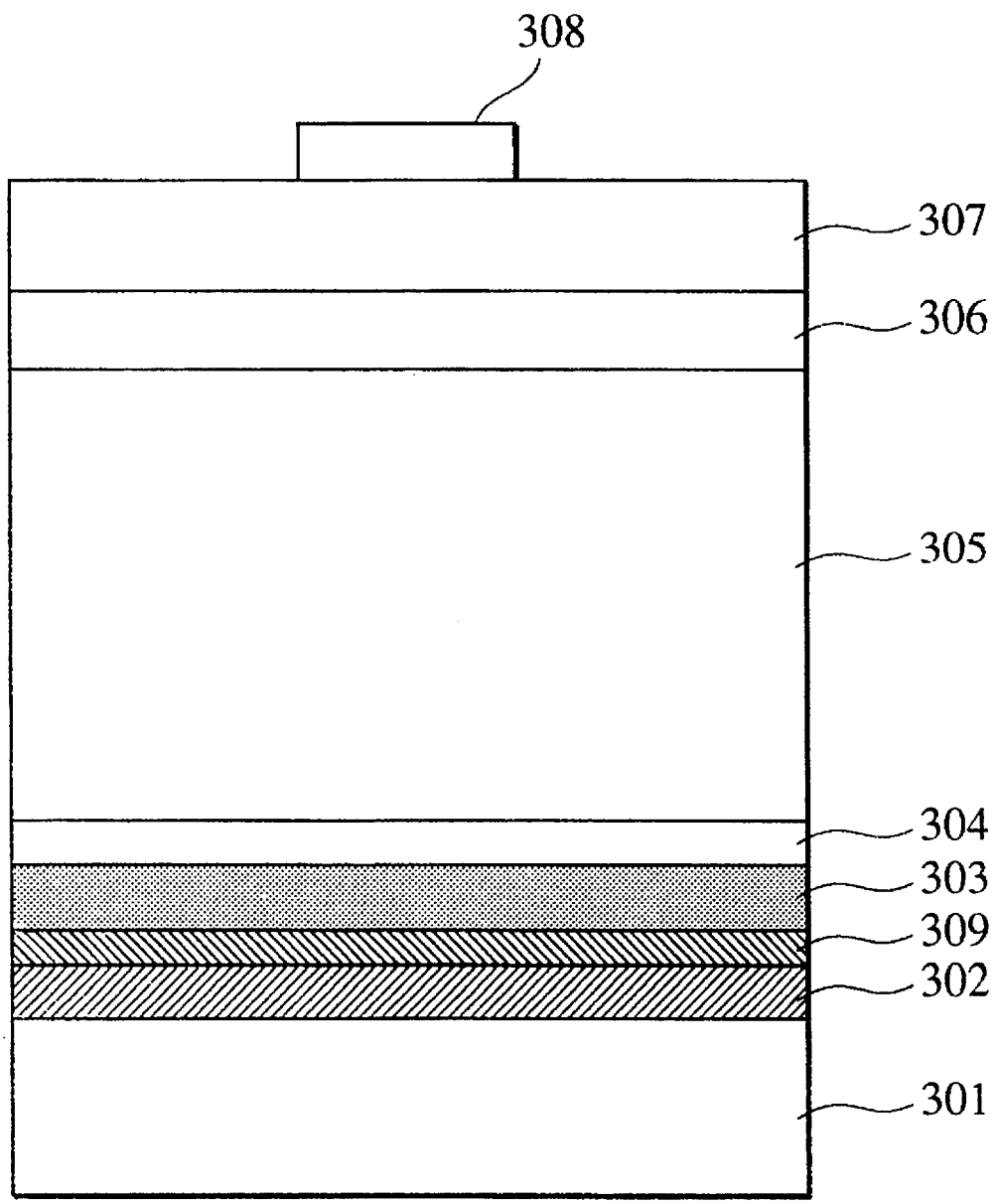
FIG. 3 is a schematic sectional view showing the layer structure of a photovoltaic device of the present invention.

FIG. 3 is a schematic sectional view of a photovoltaic device produced according to the present invention. The photovoltaic device comprises a substrate 301, a metal layer 302, a metal oxide 309 formed by non-reactive sputtering, a metal oxide 303 formed by reactive sputtering, semiconductor layers 304, 305, and 306 for performing photoelectric conversion, which are respectively made of n-type non-single crystal Si as a first conductivity type layer, i-type non-single crystal Si, and p-type non-single crystal Si as a second layer of an opposite conductivity type to the first conductivity type layer, a transparent conductive film 307, and a collector electrode 308.

Substrate (301)

Preferred materials of the substrate 301 withstand transformation and distortion at the temperatures required for forming the semiconductor films, and have a desired strength and conductivity. Specifically, these include metals such as stainless steel, aluminum and alloys of these materials, iron and alloys thereof, copper and alloys thereof, thin sheets and complexes of these metals, a sheet made of a heat-resistant resin such as polyimide, polyamide, polyethylene terephthalate and epoxy, or a complex of the above materials and glass fiber, carbon fiber, boron fiber, metallic fiber or the like, or a glass plate the surface of which is conductively treated with a single metal or an alloy or the like by plating, evaporation, sputtering, or coating.

It is preferable that the substrate, which is to be continuously formed, be as thin as possible in view of costs, storage space and the like as long as it has sufficient strength as to maintain its rolled shape when being transported. Specifically, a preferable thickness of the substrate is 0.05 mm to 1 mm. When a thin plate of metal or the like is used as the substrate, a desired strength can be easily obtained even if the plate is relatively thin.

The width of the substrate is not especially limited as long as the substrate can be formed uniformly, and is determined by the size of the semiconductor film forming means, the chamber for the forming means, etc.

There is also no special limitation on the length of the substrate. The substrate may have such length as to be wound into a roll, or may be further lengthened by welding together a plurality of lengths.

When the substrate is made of a metal or the like having electric conductivity, it may be used as an electrode for outputting direct current. When the substrate is made of an electrically insulating material, for example, synthetic resin, it is preferable to make a current output electrode by previously subjecting the side of the insulating material, on which a semiconductor film is formed, to conductive treatment with a single metal, such as Al, Ag, Pt, Au, Ni, Ti, Mo, W, Fe, V, Cr, Cu, stainless steel, brass, and Nichrome, or an alloy of those metals by plating, evaporation, sputtering, or the like.

Metal Layer (302)

When the reflectance of the substrate is low, a metal layer is formed on the surface of the substrate to increase its reflectance for long wavelength light. Ag, Al, Cr, Cu and the like are preferably used as material of the metal layer. This metal layer may have a multilayer structure from the viewpoint of adhesion to the substrate, costs, etc.

Metal Oxides (303, 309)

A metal oxide is provided to prevent mutual diffusion of component elements between the substrate and/or the metal layer and the semiconductor films, to prevent short circuits, and to confine (or trap) incident light in the photovoltaic device by causing multiple interference of thin films. Preferable materials of the metal oxide are, for example, ZnO, $SnO_2$, $In_2O_3$, and TiO.

The surface of the substrate may be smooth or may have microscopic asperities thereon. However, if the asperities on the substrate are too large, the semiconductor layers formed on the substrate are sometimes badly influenced. Each of the asperities has a spherical, conical, or pyramidal shape, and the maximum height (Rmax) thereof is preferably 50 nm to 500 nm, by which light is reflected irregularly on the surface of the substrate and the optical path length of the reflected light is increased.

The thickness of the metal oxide is determined in view of the characteristics of the photovoltaic device, such as the electric characteristics and transmittance of the films.

In particular, since the photovoltaic device is operated in cycles over a wide range of temperature and humidity, for example, in the open air, it is necessary to take film peeling caused by membrane stress into consideration. Accordingly, a preferable thickness of the metal oxide is 350 nm to 1.5 µm.

In the present invention, if the first metal oxide, which substantially has no detrimental influence on the underlying metal layer, is too thin, it is seriously affected by the deposition conditions of the second metal oxide deposited thereon. Therefore, a preferable thickness of the first metal oxide is more than 20 nm. If the first metal oxide is too thick, film deposition takes much time. Furthermore, if the metal layer, the first metal oxide layer, and the second metal oxide layer are deposited successively, the film forming chamber for forming the first metal oxide is required to be large, which causes the film deposition conditions to be unstable. Therefore, a preferable thickness of the first metal oxide is less than one-third of the total thickness of the first and second metal oxide layers.

Two or more layers of the second metal oxide may be formed as a second metal oxide layer by using different chambers or different film deposition conditions.

Transparent Conductive Film (307)

It is preferable that the transparent conductive film 307 have a light transmittance of more than 85% to efficiently absorb light from the sun, a cool white fluorescent lamp or the like into the semiconductor layers, and that the sheet resistance thereof be less than 100Ω to prevent the transparent conductive layer from being an electrical resistance to the output of the photovoltaic device. Materials having such characteristics are, for example, metal oxides, such as $SnO_2$, $In_2O_3$, ZnO, CdO, $Cd_2SnO_4$ and ITO ($In_2O_3+SnO_2$), and a metal thin film formed by making a metal, such as Au, Al, or Cu, into a translucent film which is so thin as to transmit the light to be absorbed in the semiconductor layers. Since the transparent conductive film is laid on the p-type semiconductor layer 306 in FIG. 3, the transparent conductive film and the p-type semiconductor layer are required to be made of materials which adhere well to each other, and may be formed by resistance heating evaporation, electron beam heating evaporation, sputtering, spraying, or the like. One of these methods is appropriately selected as required.

Collector Electrode (308)

The collector electrode is provided on the transparent conductive film to reduce the surface resistance of the transparent conductive film, and is made of metal, such as Ag, Cr, Ni, Al, Ag, Au, Ti, Pt, Cu, Mo, W, or an alloy of these metals in form of a thin film or a wire, or a conductive paste containing the above metals. These electrode materials may be laid one on another. Furthermore, the shape and area of the collector electrode are appropriately so designed as to provide a sufficient amount of incident light on the semiconductor layers.

For example, it is preferable that the collector electrode extend uniformly over the light receiving surface of the photovoltaic device, and the area thereof be preferably less than 15%, and more preferably less than 10% of the light receiving area.

The sheet resistance is preferably less than 50Ω, and more preferably, less than 10Ω.

First and Second Conductivity Type Layers (304, 306)

As the material of the first and second conductivity type layers, a non-single crystal semiconductor composed of one or more kinds of atoms in Group IV of the periodic table is suitable. Furthermore, a microcrystalline semiconductor is the most suitable as the layer on the incident light side to allow as much light as possible to be absorbed into the i-type semiconductor. The diameter of the microcrystals is preferably 3 nm to 20 nm, and most preferably, 3 nm to 10 nm.

If the first or second layer has n-type conductivity, atoms in Group VA of the periodic table are suitable as dopant additives. Above all, phosphorus (P), nitrogen (N), arsenic (As), and antimony (Sb) are most suitable.

If the first or second layer has p-type conductivity, atoms in Group IIIA of the periodic table are suitable as dopant additives. Above all, boron (B), aluminum (Al), and gallium (Ga) are most suitable.

The thickness of the first and second conductive layers is preferably 1 nm to 50 nm, and most preferably 3 nm to 10 nm.

In order to decrease light absorption in the layer on the incident light side, it is preferable to use a semiconductor layer having a larger band gap than that of the semiconductor composing the i-type layer. Atoms such as C, N, O, Ge, and Sn serve to change the band gap width. For example, it is most preferable that non-single crystal silicon-carbon be used as the layer on the incident light side when the i-type layer is made of amorphous silicon.

I-Type Layer (305)

As the semiconductor material used in the i-type layer, semiconductors composed of one or more kinds of atoms in Group IV of the periodic table, such as Si, Ge, C, SiC, GeC, SiSn, GeSn and SnC, are used. Also, group III–V compound semiconductors such as GaAs, GaP, GaSb, InP, and InAs, group II–VI compound semiconductors such as ZnSe, ZnS, ZnTe, CdS, CdSe, and CdTe, group I–III–VI compound semiconductors such as $CuAlS_2$, $CuAlSe_2$, $CuAlTe_2$, $CuInS_2$, $CuInSe_2$, $CuInTe_2$, $CuGaS_2$, $CuGaSe_2$, $CuGaTe_2$, $AgInSe_2$, and $AgInTe_2$, group II–IV–V compound semiconductors such as $ZnSiP_2$, $ZnGeAs_2$, $CdSiAs_2$, and $CdSnP_2$, and metal oxide semiconductors such as $Cu_2O$, $TiO_2$, $In_2O_3$, $SnO_2$, ZnO, CdO, $Bi_2O_3$, and $CdSnO_4$ may be used.

The thickness of the i-type layer is an important parameter which influences the characteristics of the photovoltaic device. A preferable thickness is 100 nm to 1000 nm, and the most preferable thickness is 200 nm to 600 nm. It is preferable that the thickness be designed in the above range in view of the absorption coefficient of the i-type layer and an interface layer, and the spectrum of the light source.

Non-Reactive and Reactive Sputtering

In non-reactive sputtering, inert gas ions, for example, Ar, which are accelerated by an electric field, collide with a target made of a desired material and a film is directly deposited on a substrate from atoms or molecules ejected from the surface of the target. On the other hand, when a film of a compound such as ZnO or SiN is formed by reactive sputtering, a target made of Zn or Si, which is a component of the desired film material, is used, reactive gas is introduced into the film forming chamber, and a film of ZnO or SiN is formed by reacting atoms, Zn or Si, ejected from the target, and $O_2$ gas or $N_2$ gas.

The maximum and minimum pressures in this film deposition process are determined by the geometry of the film forming apparatus used, the size of the target, and the like. Preferably, pressures ranging from 0.1 Pa to 3.0 Pa allow deposition of a high-quality film both in non-reactive sputtering and reactive sputtering.

Embodiment 1

Figure 1:
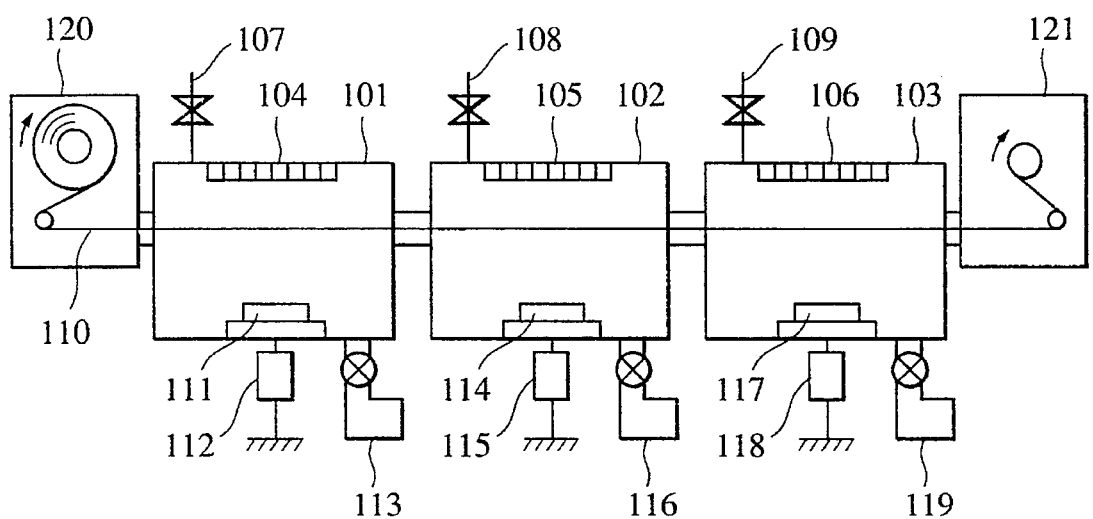
FIG. 1 is a schematic sectional view of a thin film forming apparatus according to an embodiment of the present invention.

FIG. 1 is a conceptual view of a thin film forming apparatus according to this embodiment. As shown in FIG. 1, the apparatus comprises three film forming chambers 101, 102 and 103, and a delivery chamber 120 and a take-up chamber 121 for a weblike substrate 110 provided on both ends of the apparatus, whereby films are formed successively. Targets 111, 114, and 117 provided in the chambers 101, 102, and 103 are respectively connected to power supplies 112, 115, and 118, and the output of the power supplies 112, 115, and 118 can be controlled.

First, an Ag target, a ZnO target, and a Zn target are respectively installed as the targets 111, 114, and 117. Then, the weblike substrate 110 is loaded in the substrate delivery chamber 120 and the substrate take-up chamber 121. The film forming chambers 101, 102, and 103 are respectively evacuated by using exhaust devices 113, 116, and 119 so that the pressures therein are reduced to a predetermined value, and then, a heater 104 is so controlled that the substrate temperature rises to 150° C. Then, Ar gas is introduced from a gas introduction valve 107 into the film forming chamber 101 to obtain a film deposition pressure of 0.25 Pa. After that, 1.0 kw of power is applied to the Ag target 111 from the power supply 112, and an Ag film of 60 nm in thickness is deposited on a predetermined part of the weblike substrate 110 by non-reactive sputtering. After the film deposition in the film forming chamber 102 is completed, the weblike substrate 110 moves into the film forming chamber 102. A heater 105 of the film forming chamber 102 is so adjusted that the substrate temperature rises to 235° C. Then, Ar gas is introduced from a gas introduction valve 108 into the film forming chamber 102 to obtain a film deposition pressure of 0.25 Pa. After that, 5.5 kw of power is applied from the power supply 115 to the ZnO target 114, and a ZnO film of 100 nm in thickness is deposited on the predetermined part of the weblike substrate 110 by non-reactive sputtering. After the film deposition in the film forming chamber 102 is completed, the weblike substrate 110 moves into the film forming chamber 103. A heater 106 of the film forming chamber 103 is so adjusted that the substrate temperature rises to 235° C. A mixed gas composed of Ar and $O_2$ in proportions of 1:1 is introduced from a gas introduction valve 109 into the film forming chamber 103 to obtain a film deposition pressure of 1 Pa. After that, 12 kw of power is applied from the power supply 118 to the Zn target 117, and a ZnO film of 900 nm in thickness is deposited by reactive sputtering on the predetermined part of the weblike substrate 110, where the ZnO film having a thickness of 100 nm has previously been deposited in the film forming chamber 102. When a metal layer, a non-reactively sputtered metal oxide film, and a reactively sputtered metal oxide film are deposited on a continuously moving substrate, it is preferable to provide gas gates between the chambers to prevent the gases from flowing into the other chambers, and cause Ar gas (the same as the sputtering gas, which has no influence on the deposition process) to flow through the gas gates.

The weblike substrate with the 1 μm ZnO film thus formed thereon was taken out from the substrate take-up chamber 121, and the specific resistance, discoloration, and film deposition time thereof were examined. As for the specific resistance, a film of Cr/Ag/Cr (40 nm/1 μm/20 nm) was deposited as an upper electrode on the obtained ZnO film by vacuum evaporation, and the resistance of a back reflecting layer in the longitudinal direction was measured by flowing direct current between the Cr/Ag/Cr film and the substrate.

Table 1 shows, as comparative examples, the specific resistance, discoloration, and film deposition time in a case in which a 1 μm ZnO film was deposited by non-reactive sputtering using only ZnO targets, and a case in which a 1 μm ZnO film was deposited by reactive sputtering using only Zn targets. The film deposition conditions were the same as those of the film forming chamber 102 of the above Embodiment 1 during nonreactive sputtering, and the same as those of the film forming chamber 103 during reactive sputtering. The substrate transport speed was changed to obtain a constant film thickness.

As shown in Table 1, the film forming method of the present invention can deposit at high rate a film having low resistance without causing discoloration due to oxidation of the metal layer. Therefore, the film exhibits high reflectance and high electric conductivity when used in a photovoltaic device. In one of the comparative examples where the 1 μm ZnO film was formed only by reactive sputtering, a high deposition rate can also be achieved. However, an underlying metal layer is discolored by oxidation due to reactive sputtering, and does not satisfy the characteristics as a back reflecting film. In the other comparative example where the 1 μm ZnO film was formed only by non-reactive sputtering, although the film is not discolored and sufficiently satisfies the requirements for use in a thin-film semiconductor photovoltaic device, the deposition rate is low and a correspondingly long deposition time is needed. In other words, a metal oxide film layer, which prevents the influence of oxidation and sufficiently satisfies the requirements for a back reflecting layer, can be formed at high rate by forming a thin metal oxide film on an underlying layer by non-reactive sputtering using a metal oxide target and Ar gas as discharge gas, and then, forming a metal oxide film on the previously deposited thin metal oxide film by reactive sputtering using a metal target, oxygen gas as a reactive gas, and Ar gas as discharge gas.

The metal layer and the metal oxides, which are substantially different in thickness, are respectively formed in the metal layer forming chamber 101, the metal oxide forming chamber 102 for performing non-reactive sputtering, and the metal oxide forming chamber 103 for performing reactive sputtering. Therefore, the whole film forming apparatus can be greatly downsized and a uniform film can be easily formed.

Embodiment 2

Film deposition was carried out in the same manner using the same sputtering device as in the above Embodiment 1, an underlying metal layer was made of Al or Cu, and the specific resistance, discoloration, and film deposition time of an obtained film were examined. The target 111 in the film forming chamber 101 was replaced with an Al or Cu target, and a film of 60nm in thickness was deposited in a similar manner to that of the above Embodiment 1. After that, ZnO films were deposited by different methods similarly to the above Embodiment 1. As comparative examples, ZnO films of 1 μm in thickness were respectively deposited by non-reactive sputtering using only ZnO targets and reactive sputtering using only Zn targets. The specific resistance, discoloration, and film deposition times in these examples are shown in Tables 2 and 3. Table 2 shows the examination results when Al was used as an underlying metal layer, and Table 3 shows the examination results when Cu was used as an underlying layer.

As Tables 2 and 3 reveal, whether the underlying metal layer is made of Al or Cu, the film forming method of the present invention allows, similarly to the above Embodiment 1, a low-resistance film to be deposited at high rate without causing discoloration of the film due to oxidation. In one of the comparative examples in which the 1 μm ZnO film is deposited only by reactive sputtering, high deposition rate can be obtained. However, the underlying metal layer is oxidized, and the film has high resistance when the underlying metal layer is made of Al, and is discolored when the underlying metal layer is made of Cu. In the other comparative example in which the 1 μm ZnO film is formed only by non-reactive sputtering, the obtained ZnO film has low resistance, is not discolored, and sufficiently satisfies the requirements for use in a thin-film semiconductor photovoltaic device. However, the film deposition rate is low and film deposition takes too much time. In other words, when a underlying metal layer is made of metals other than Ag, a metal oxide film layer, which prevents the influence of oxidation and sufficiently satisfies the requirements for use as a back reflecting layer, can also be formed at a high rate by depositing a thin metal oxide film on the underlying layer by non-reactive sputtering using a metal oxide target and Ar gas as discharge gas, and then, depositing a metal oxide film on the previously deposited thin metal oxide film by reactive sputtering using a metal target, oxygen gas as reactive gas, and Ar gas as discharge gas.

Embodiment 3

Figure 2:
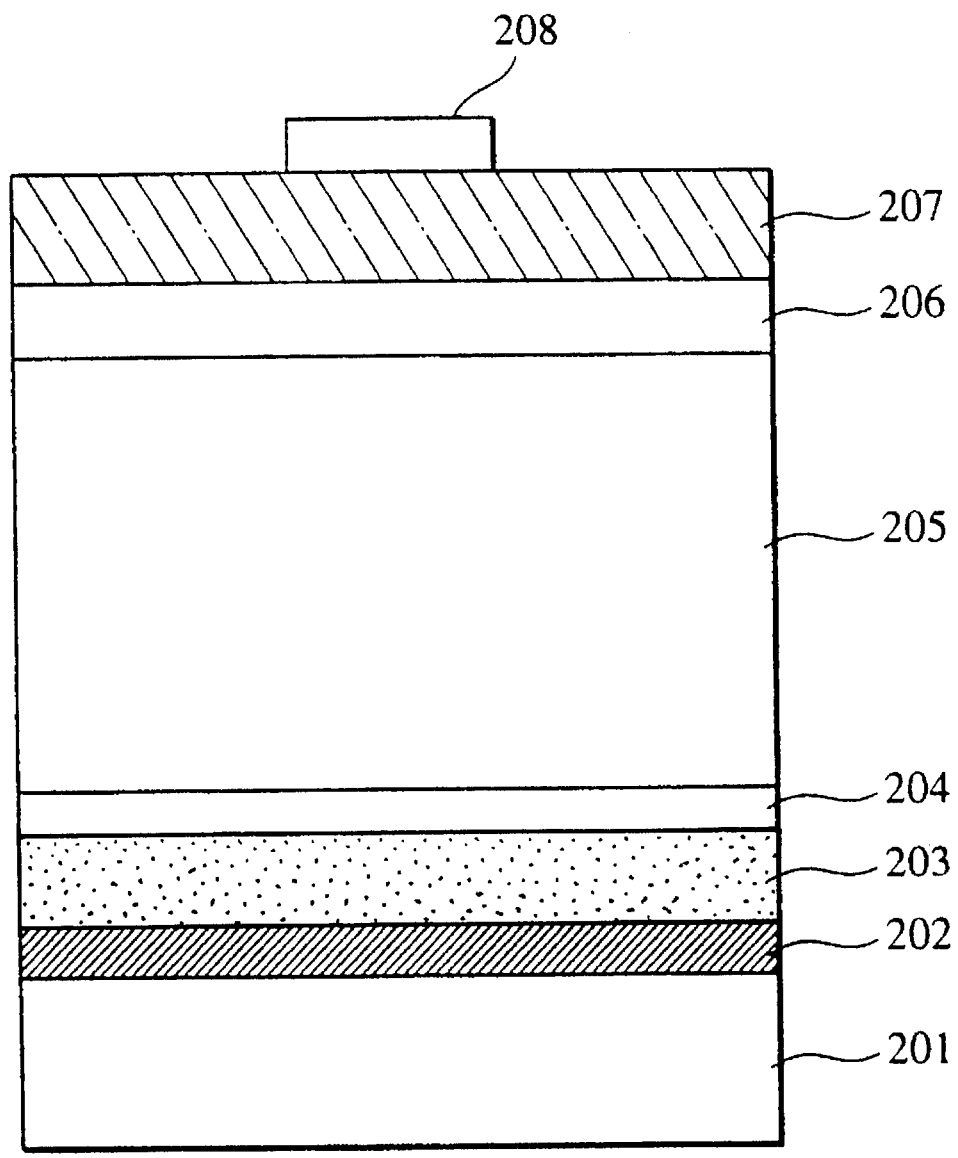
FIG. 2 is a view showing the layer structure of a conventional thin-film semiconductor photovoltaic device.

The thickness of a ZnO film, which was deposited by non-reactive sputtering in the film forming chamber 102 of the same sputtering device as that of the above Embodiment 1, was changed, and the relationship between the film thickness and the characteristics of the film as a back reflecting layer was examined. The thickness of the ZnO film deposited by non-reactive sputtering was changed to 10 nm, 20 nm, 50 nm, and 100 nm by changing the transport speed of the weblike substrate 110 for the same film deposition conditions, such as gas pressure, substrate temperature, and power, as in Embodiment 1, and the specific resistance was measured in a similar manner to that of Embodiment 1. Furthermore, in this embodiment, a pin-type a-Si photovoltaic device having the structure shown in FIG. 2 was produced by using these back reflecting layers, and evaluated as a thin-film photovoltaic device. In order to produce this thin-film photovoltaic device, four back reflecting layers were each cut in a size of 5 cm×5 cm, and then, set in the chamber of a capacitive coupled RF CVD system (CHJ-3030 from Ulvac). After that, evacuation was performed by an exhaust pump, and the substrate temperature was set at 250° C. After evacuation was performed to obtain a predetermined pressure, 300 sccm of $SiH_4$, 4 sccm of $SiF_4$, 55 sccm of $PH_3/H_2$ (1% $H_2$ diluted) and 40 sccm of $H_2$ were introduced from gas introduction pipes, a pressure of 1 Torr was maintained in the chamber by adjusting the opening of a throttle valve, and 200 W of power was applied for five minutes by a RF power supply. Thereby, an a-Si layer 204 having n-type conductivity (referred to as "n-type" hereinafter) was deposited on a ZnO film 203. After air exhaustion was performed again, 300 sccm of $SiH_4$, 4 sccm of $SiF_4$, and 40sccm of $H_2$ were introduced from gas introduction pipes, a pressure of 1 Torr was maintained in the chamber by adjusting the opening of the throttle valve, and 150 W of power was applied for forty minutes from the RF power supply. Thereby, an a-Si layer 205 having i-type conductivity was deposited on the n-type a-Si layer 204. After air exhaustion was performed again, 50 sccm of $SiH_4$, 50 sccm of $BF_3/H_2$ (1% $H_2$ diluted), and 500 sccm of $H_2$ were introduced from gas introduction pipes, a pressure of 1 Torr was maintained in the chamber by adjusting the opening of the throttle valve, and 300 W of power was applied for two minutes from the RF power supply. Thereby, a p-type μc-Si layer 206 was deposited on the i-type a-Si layer 205. Next, the sample was taken out of the RF CVD system, an ITO film as an upper electrode was deposited on the sample by a resistance heating evaporation system, a paste containing an iron chloride solution was printed, and a desired pattern of a transparent electrode 207 was formed. Furthermore, a collector electrode 208 was formed from an Ag paste by screen printing, by which a thin-film semiconductor solar cell was competed. Four kinds of samples were produced in this method, and subjected to evaluation of its characteristics under irradiation of AM 1.5 (100 mW/cm$^2$) light. The evaluation result is shown in Table 4.

As shown in Table 4, when the thickness of the ZnO film deposited by non-reactive sputtering using the ZnO target was 10 nm, the ZnO film was discolored by oxidation of the underlying Ag film and could not sufficiently act as an oxidation preventing film. It is considered that oxidation of the metal layer impaired the characteristics for use in a thin-film semiconductor photovoltaic device similarly to the case in which the ZnO film was deposited on the Ag underlying metal layer by reactive sputtering. To the contrary, when the thickness of the ZnO film was more than 20 nm, the deposited film was not discolored and sufficiently satisfies the requirements for use in a thin-film semiconductor photovoltaic device. Therefore, it is preferable that the thickness of the ZnO film as an intermediate layer be at least 20 nm.

Similar effects can be obtained even if ZnO is replaced with other metal oxides such as $SnO_2$, $In_2O_3$, and TiO.

As described above, according to the present invention, when metal oxide films are deposited by a thin-film forming apparatus using sputtering or the like, a thin metal oxide film is deposited on an underlying metal layer by non-reactive sputtering using a metal oxide target, and then, a metal oxide film is deposited on the above metal oxide film by reactive sputtering which uses a target made of the metal contained in the above metal oxide film and oxygen gas is introduced. A film having sufficient characteristics for use in a photovoltaic device can be thereby formed at high rate, which results in high economies of mass production, without oxidizing the underlying metal layer. Furthermore, the use of the apparatus of the present invention allows a uniform film to be deposited in a large area and at high rate, and the system itself can be downsized.

TABLE 1

(Ag)

| Element No. | Deposition Condition | Deposition Time (sec) | Specific Resistance ($\Omega$cm) | Discoloration | Conversion Efficiency (%) |
|---|---|---|---|---|---|
| 1 | Non-reactive Sputtering + Reactive Sputtering | 105 | 5 × 10E + 2 | Not Found | 9.0 |
| 2 | Reactive Sputtering | 93 | 8 × 10E + 3 | Blackened | 5.9 |
| 3 | Non-reactive Sputtering | 210 | 5 × 10E + 2 | Not Found | 9.1 |

TABLE 2

(Al)

| Element No. | Deposition Condition | Deposition Time (sec) | Specific Resistance ($\Omega$cm) | Discoloration | Conversion Efficiency (%) |
|---|---|---|---|---|---|
| 1 | Non-reactive Sputtering + Reactive Sputtering | 100 | 3 × 10E + 2 | Not Found | 8.9 |
| 2 | Reactive Sputtering | 88 | 4 × 10E + 6 | Not Found | 6.0 |
| 3 | Non-reactive Sputtering | 205 | 4 × 10E + 2 | Not Found | 9.0 |

TABLE 3

(Cu)

| Element No. | Deposition Condition | Deposition Time (sec) | Specific Resistance ($\Omega$cm) | Discoloration | Conversion Efficiency (%) |
|---|---|---|---|---|---|
| 1 | Non-reactive Sputtering + Reactive Sputtering | 108 | 3 × 10E + 2 | Not Found | 9.1 |
| 2 | Reactive Sputtering | 96 | 5 × 10E + 3 | Discolored | 6.2 |
| 3 | Non-reactive Sputtering | 213 | 3 × 10E + 2 | Not Found | 9.1 |

TABLE 4

| Thickness of ZnO Film by Non-Reactive Sputtering | Specific (nm) Resistance ($\Omega$cm) | Discoloration | Conversion Efficiency (%) |
|---|---|---|---|
| 10 | 8 × 10E + 3 | Discolored | 6.1 |
| 20 | 2 × 10E + 3 | Not Found | 8.5 |
| 50 | 5 × 10E + 2 | Not Found | 9.0 |
| 100 | 4 × 10E + 2 | Not Found | 9.1 |

What is claimed is:

1. A method of producing a photovoltaic device, comprising the steps of:
   forming a first metal oxide film on a metal member by non-reactive sputtering;
   forming a second metal oxide film composed of the same basic material as said first metal oxide film on said first metal oxide film by reactive sputtering; and
   forming a semiconductor layer on said second metal oxide film.

2. A method of producing a photovoltaic device according to claim 1, wherein said metal member is a metal layer formed on a substrate.

3. A method of producing a photovoltaic device according to claim 2, wherein said metal layer comprises at least one of Ag, Al, and Cu.

4. A method of producing a photovoltaic device according to claim 1, wherein said semiconductor is a non-single crystal silicon semiconductor.

5. A method of producing a photovoltaic device according to claim 1, wherein the thickness of said first metal oxide film is at least 20 nm.

6. A method of producing a photovoltaic device according to claim 1, wherein said first and second metal oxide films are made of at least one of ZnO, $SnO_2$, $In_2O_3$, and TiO.

7. A method of producing a photovoltaic device according to claim 1, wherein said semiconductor layer comprises a p-type semiconductor layer and an n-type semiconductor layer.

8. A method of producing a photovoltaic device according to claim 7, wherein said semiconductor layer comprises an i-type semiconductor layer between said p-type and n-type semiconductor layers.

9. A method of producing a photovoltaic device according to claim 8, wherein said i-type semiconductor layer comprises a non-single crystal silicon carbon.

10. A method of producing a photovoltaic device according to claim 7, wherein the thickness of said p-type semiconductor layer or n-type semiconductor layer is between 1 nm and 50 nm.

11. A method of producing a photovoltaic device according to claim 7, wherein said semiconductor layer includes an element for changing the band gap width on the light incident side.

12. A method of producing a photovoltaic device according to claim 11, wherein said element is at least one of the elements from the group consisting of C, N, O, Ge, and Sn.

13. A method of producing a photovoltaic device according to claim 1, wherein a transparent conductor layer is provided on said semiconductor layer.

14. A method of producing a photovoltaic device according to claim 13, wherein a collector electrode is provided on said transparent conductor layer.

15. A method of producing a photovoltaic device according to claim 1, wherein the thickness of said second metal oxide film is less than one-third of the total thickness of said first and second metal oxide films.

16. A method of producing a photovoltaic device according to claim 1, further comprising the step of forming another metal oxide layer on said second metal oxide layer.

17. A method of producing a semiconductor device, comprising the step of forming a metal oxide film on a metal member and at least the step of forming a semiconductor layer on said metal oxide layer, wherein said step of forming the metal oxide layer comprises the step of forming a first metal oxide film by non-reactive sputtering and the step of forming a second metal oxide film on said first metal oxide film by reactive sputtering.

18. A method of producing a semiconductor device according to claim 17, wherein said metal member is a metal layer formed on a substrate.

19. A method of producing a semiconductor device according to claim 18, wherein said metal layer comprises at least one of the elements in the group consisting of Ag, Al, and Cu.

20. A method of producing a semiconducter device according to claim 17, wherein said semiconductor layer comprises a non-single crystal silicon semiconductor layer.

21. A method of producing a semiconductor device according to claim 17, wherein the thickness of said first oxide layer is at least 20 nm.

22. A method of producing a semiconductor device according to claim 17, wherein said first and second metal oxide layers comprise at least one of the compounds selected from the group consisting of ZnO, SnO$_2$, In$_2$O$_3$, and TiO.

23. A method of producing a semiconductor device according to claim 17, wherein said semiconductor layer comprises a p-type semiconductor layer and an n-type semiconductor layer.

24. A method of producing a semiconductor device according to claim 23, wherein said semiconductor layer comprises an i-type semiconductor layer between p-type and n-type semiconductor layers.

25. A method of producing a semiconductor device according to claim 24, wherein said i-type semiconductor layer comprises a non-single crystal silicon-carbon.

26. A method of producing a semiconductor device according to claim 23, wherein the thickness of said p-type semiconductor layer or n-type semiconductor layer is between 1 nm and 50 nm.

27. A method of producing a semiconductor device according to claim 23, wherein said semiconductor layer includes an element for changing the band gap width on the light incident side.

28. A method of producing a semiconductor device according to claim 24, wherein said element is at least one of the elements in the group consisting of C, N, O, Ge, and Sn.

29. A method of producing a semiconductor device according to claim 17, wherein a transparent conductor layer is provided on said semiconductor layer.

30. A method of producing a semiconductor device according to claim 29, wherein a collector electrode is provided on said transparent conductor layer.

31. A method of producing a semiconductor device according to claim 17, wherein the thickness of said second metal oxide film is less than-one-third of the total thickness of said first and second metal oxide films.

32. A method of producing a semiconductor device according to claim 17, further comprising the step of forming another metal oxide layer on said second metal oxide layer.

33. A method of producing a semiconductor device, comprising the step of forming a metal oxide film on a metal member and at least the step of forming a semiconductor layer on said metal oxide layer, wherein said step of forming the metal oxide layer comprises the step of forming a first metal oxide film by non-reactive sputtering and the step of forming a second metal oxide film on said first metal oxide film which substantially is the same material as said first metal oxide film by reactive sputtering.

34. A method of producing a semiconductor device according to claim 33, wherein said metal member is a metal layer formed on a substrate.

35. A method of producing a semiconductor device according to claim 34, wherein said metal layer comprises at least one of the elements in the group consisting of Ag, Al, and Cu.

36. A method of producing a semiconductor device according to claim 33, wherein said semiconductor layer comprises a non-single crystal silicon semiconductor layer.

37. A method of producing a semiconductor device according to claim 33, wherein the thickness of said first metal oxide layer is at least 20 nm.

38. A method of producing a semiconductor device according to claim 33, wherein said first and second metal oxide layers comprise at least one of the compounds in the group consisting of ZnO, SnO$_2$, In$_2$O$_3$, and TiO.

39. A method of producing a semiconductor device according to claim 33, wherein said semiconductor layer comprises a p-type semiconductor layer and an n-type semiconductor layer.

40. A method of producing a semiconductor device according to claim 39, wherein said semiconductor layer comprises an i-type semiconductor layer between said p-type and n-type semiconductor layers.

41. A method of producing a semiconductor device according to claim 40, wherein said i-type semiconductor layer comprises a non-single crystal silicon-carbon.

42. A method of producing a semiconductor device according to claim 39, wherein the thickness of said p-type semiconductor layer or n-type semiconductor layer is between 1 nm and 50 nm.

43. A method of producing a semiconductor device according to claim 39, wherein said semiconductor layer includes an element for changing the band gap width on the light incident side.

44. A method of producing a semiconductor device according to claim 43, wherein said element is at least one of the elements in the group consisting of C, N, O, Ge, and Sn.

45. A method of producing a semiconductor device according to claim 33, wherein a transparent conductor layer is provided on said semiconductor layer.

46. A method of producing a semiconductor device according to claim 45, wherein a collector electrode is provided on said transparent conductor layer.

47. A method of producing a semiconductor device according to claim 33, wherein the thickness of said second metal oxide film is less than one third of the total thickness of said first and second metal oxide films.

48. A method of producing a semiconductor device according to claim 33, further comprising the step of forming another metal oxide layer on said second metal oxide layer.

* * * * *

UNITED STATES PATENT AND TRADEMARK OFFICE
CERTIFICATE OF CORRECTION

PATENT NO. : 5,612,229

DATED : March 18, 1997

INVENTOR : YUMI YOSHIDA

It is certified that error appears in the above-identified patent and that said Letters Patent is hereby corrected as shown below:

COLUMN 6

Line 41, "In2O$_3$," should read --In$_2$O$_3$,--.

COLUMN 10

Line 13, "a" should read --an--.

COLUMN 11

Line 10, "competed." should read --completed.--.

COLUMN 13

Line 10, "silicon carbon." should read --silicon-carbon.--.

Line 58, "oxidelayers" should read --oxide layers--.

UNITED STATES PATENT AND TRADEMARK OFFICE
CERTIFICATE OF CORRECTION

PATENT NO. : 5,612,229

DATED : March 18, 1997

INVENTOR : YUMI YOSHIDA

It is certified that error appears in the above-identified patent and that said Letters Patent is hereby corrected as shown below:

COLUMN 14

```
Line 12, "claim 24," should read --claim 27,--.
Line 23, "than-one-third" should read --than one-third--.
```

Signed and Sealed this

Thirty-first Day of March, 1998

Attest:

BRUCE LEHMAN

Attesting Officer

Commissioner of Patents and Trademarks